United States Patent
Ookubo et al.

(10) Patent No.: US 8,003,207 B2
(45) Date of Patent: Aug. 23, 2011

(54) ADHESIVE BONDING SHEET, SEMICONDUCTOR DEVICE USING SAME, AND METHOD FOR MANUFACTURING SUCH SEMICONDUCTOR DEVICE

(75) Inventors: Keisuke Ookubo, Ichihara (JP); Teiichi Inada, Tsukuba (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 193 days.

(21) Appl. No.: 12/534,241

(22) Filed: Aug. 3, 2009

(65) Prior Publication Data
US 2010/0003512 A1    Jan. 7, 2010

Related U.S. Application Data

(62) Division of application No. 11/596,923, filed as application No. PCT/JP2005/008971 on May 17, 2005, now Pat. No. 7,578,891.

(30) Foreign Application Priority Data

May 18, 2004  (JP) ............................. P2004-147973

(51) Int. Cl.
*H01L 21/58*  (2006.01)
*B32B 7/10*  (2006.01)

(52) U.S. Cl. ............... 428/343; 438/455; 257/E21.122; 257/E21.567

(58) Field of Classification Search .......... 438/455; 428/343; 257/E21.122, E21.567
See application file for complete search history.

(56) References Cited

U.S. PATENT DOCUMENTS

| | | | |
|---|---|---|---|
| 4,913,960 A | 4/1990 | Kuroda et al. | |
| 5,281,473 A | 1/1994 | Ishiwata et al. | |
| 5,439,956 A | 8/1995 | Noguchi | |
| 5,928,791 A * | 7/1999 | Rosenmayer | 428/421 |
| 6,042,922 A * | 3/2000 | Senoo et al. | 428/66.6 |
| 6,309,730 B1 * | 10/2001 | Sumi | 428/141 |
| 6,312,800 B1 * | 11/2001 | Noguchi et al. | 428/354 |
| 6,350,844 B1 * | 2/2002 | Ono et al. | 528/170 |
| 6,436,795 B2 * | 8/2002 | Noguchi et al. | 438/460 |
| 6,524,700 B2 * | 2/2003 | Masuda et al. | 428/343 |

(Continued)

FOREIGN PATENT DOCUMENTS
JP  4-196342  7/1992
(Continued)

OTHER PUBLICATIONS
Translation of the International Preliminary Report on Patentability dated Nov. 30, 2006, for Application No. PCT/JP2005/008971.
(Continued)

*Primary Examiner* — George Fourson
(74) *Attorney, Agent, or Firm* — Antonelli, Terry, Stout & Kraus, LLP.

(57) ABSTRACT

An adhesive bonding sheet having an optically transmitting supporting substrate and an adhesive bonding layer, and being used in both a dicing step and a semiconductor element adhesion step, wherein the adhesive bonding layer comprises: a polymer component (A) having a weight average molecular weight of 100,000 or more including functional groups; an epoxy resin (B); a phenolic epoxy resin curing agent (C); a photoreactive monomer (D), wherein the Tg of the cured material obtained by ultraviolet light irradiation is 250° C. or more; and a photoinitiator (E) which generates a base and a radical by irradiation with ultraviolet light of wavelength 200-450 nm.

5 Claims, 10 Drawing Sheets

U.S. PATENT DOCUMENTS

| | | | |
|---|---|---|---|
| 6,551,862 B2 * | 4/2003 | Oota et al. | 438/118 |
| 6,689,245 B2 * | 2/2004 | Tsujimoto | 156/267 |
| 6,702,910 B2 * | 3/2004 | Noguchi et al. | 156/85 |
| 6,716,529 B2 * | 4/2004 | Sawamura et al. | 428/413 |
| 6,858,473 B2 * | 2/2005 | Hosokawa et al. | 438/118 |
| 6,879,026 B2 * | 4/2005 | Fukumoto et al. | 257/642 |
| 7,057,266 B2 * | 6/2006 | Kawai et al. | 257/666 |
| 7,163,597 B2 * | 1/2007 | Murata et al. | 156/248 |
| 7,201,969 B2 * | 4/2007 | Miyakawa et al. | 428/522 |
| 7,202,570 B2 * | 4/2007 | Nagai et al. | 257/783 |
| 7,449,367 B2 * | 11/2008 | Matsuura et al. | 438/118 |
| 7,514,143 B2 * | 4/2009 | Matsumura et al. | 428/354 |
| 7,517,724 B2 * | 4/2009 | Hatakeyama et al. | 438/114 |
| 7,718,257 B2 * | 5/2010 | Murata et al. | 428/354 |
| 2003/0064579 A1 * | 4/2003 | Miyakawa et al. | 438/628 |
| 2005/0173051 A1 * | 8/2005 | Hatai et al. | 156/247 |
| 2005/0260404 A1 * | 11/2005 | Iwade et al. | 428/325 |
| 2006/0204749 A1 * | 9/2006 | Kita et al. | 428/343 |
| 2007/0166500 A1 * | 7/2007 | Sutoh et al. | 428/41.7 |
| 2007/0172649 A1 * | 7/2007 | Aihara et al. | 428/343 |
| 2009/0065133 A1 * | 3/2009 | Takahashi | 156/250 |
| 2009/0186216 A1 * | 7/2009 | Inada et al. | 428/337 |
| 2009/0220783 A1 * | 9/2009 | Fukui et al. | 428/343 |
| 2009/0286087 A1 * | 11/2009 | Tanaka et al. | 428/418 |
| 2010/0003512 A1 | 1/2010 | Ookubo et al. | |
| 2010/0003513 A1 | 1/2010 | Ookubo et al. | |
| 2010/0099240 A1 * | 4/2010 | Watanabe et al. | 438/464 |
| 2010/0133703 A1 * | 6/2010 | Karasawa et al. | 257/777 |
| 2010/0193968 A1 * | 8/2010 | Takamoto et al. | 257/778 |
| 2010/0243159 A1 * | 9/2010 | Nishio et al. | 156/344 |

FOREIGN PATENT DOCUMENTS

| | | |
|---|---|---|
| JP | 7-15087 | 2/1995 |
| JP | 8-239636 | 9/1996 |
| JP | 10-8001 | 1/1998 |
| JP | 10-72573 | 3/1998 |
| JP | 2002-212522 | 7/2002 |
| JP | 2004-043760 | 2/2004 |
| JP | 2004-43762 | 2/2004 |
| WO | WO 03/018703 | 3/2003 |

OTHER PUBLICATIONS

Korean Official Action dated Oct. 24, 2007, for Application No. 10-2006-7024821.

U.S. Notice of Allowance and Fee(s) Due mailed Apr. 28, 2011, in U.S. Appl. No. 12/534,253.

* cited by examiner

ADHESIVE BONDING SHEET, SEMICONDUCTOR DEVICE USING SAME, AND METHOD FOR MANUFACTURING SUCH SEMICONDUCTOR DEVICE

This application is a Divisional application of prior application Ser. No. 11/596,923, filed Nov. 17, 2006, now U.S. Pat. No. 7,578,891 the contents of which are incorporated herein by reference in their entirety. No. 11/596,923 is a National Stage Application, filed under 35 USC 371, of International (PCT) Application No. PCT/JP2005/008971, filed May 17, 2005.

TECHNICAL FIELD

This invention relates to an adhesive bonding sheet, the semiconductor device using same, and method for manufacturing such semiconductor device.

BACKGROUND ART

In the prior art, silver paste was mainly used at the junction of a semiconductor device and a supporting material for a semiconductor device mounting. However, in recent years, due to the miniaturization and improvement in performance of semiconductor devices, compactness and minuteness of a supporting material are getting required. Despite these requirements, with silver paste, there were various problems, such as faults in wire bonding due to protrusion or tilting of the semiconductor device, the difficulty of controlling the thickness of an adhesive layer, and formation of voids in the adhesive layer. In order to solve these problems, filmy adhesives have come to be used in recent years. Filmy adhesive is used in the film piece sticking method or wafer back surface sticking method.

In the film piece sticking method, a reel-like adhesive film is first cut out to pieces by cutting or punching, and then stuck to a supporting material. Subsequently, a semiconductor element which has been diced into pieces in a dicing step, is joined to the obtained supporting material with the adhesive film to manufacture a supporting material with the semiconductor element attached, and a wire bonding step and sealing step are then performed to complete the semiconductor element. However, in the film piece sticking method, a dedicated assembly device is required to cut the adhesive film and stick it to the supporting member, and assembly costs were higher than those of the method using silver paste.

On the other hand, in the wafer back surface sticking method, an adhesive film was stuck to a semiconductor wafer, and then stuck to a dicing tape. This was cut into pieces in a dicing step to obtain a semiconductor element with adhesive attached. Next, the semiconductor element with adhesive is joined to a supporting member, and heating, curing and wire bonding steps are performed to complete the semiconductor device. In the wafer back surface sticking method, the semiconductor element with adhesive attached, is joined to the supporting member, so a device to cut the adhesive film into pieces is not required, and moreover, the prior art assembly device for silver paste may be used as it is, or by making a partial modification such as by adding a heating plate. Therefore, the wafer back surface sticking method is popular among assembly methods using filmy adhesive since assembly costs can be suppressed relatively low.

The semiconductor element is cut into pieces in this wafer back surface sticking method by sticking it on a dicing tape on the filmy adhesive side, and then performing a dicing step. The dicing tape used may be broadly divided into a pressure-sensitive type and a UV type. The pressure-sensitive tape normally has an adhesive coated on to a polyvinyl chloride or polyolefin base film. This dicing tape should have sufficient tackiness so that during cutting, the elements are not scattered by the rotation of the dicing saw. On the other hand, this dicing tape should have a sufficiently low tackiness so that pickup can be performed without adhesive sticking to the elements and without scratching the elements. After all this dicing tape should have contrary performance depending on the steps. Therefore, when a pressure-sensitive dicing tape was used, various types of adhesive sheet having different tackiness depending on the element size and processing conditions with a small tolerance, had to be provided and these adhesive sheet are changed over for each step. Consequently, a large number of types had to be kept in stock, and inventory management was complicated. It was also necessary to change over the adhesive sheet for each step.

However, in recent years, semiconductor elements (in particular, CPU and memory) have been progressing towards higher capacities, and the semiconductor elements have been increasing in size. Moreover, in products such as IC cards or memory cards, memories are becoming increasingly thinner. Due to the increasing size and thinness of these semiconductor elements, it is therefore no longer possible to have a pressure-sensitive dicing tape which satisfies the contradictory requirements of fixing force (high tackiness) during dicing and peeling force (low tackiness) during pickup.

Recently, a so-called UV type dicing tape is being widely used which satisfies these contradictory requirements, since it has a high tackiness during dicing, but when it is irradiated with ultraviolet light (UV) before pickup, it develops a low tackiness.

However, in the wafer back surface sticking method using a UV type dicing tape, two film sticking steps must be performed before the dicing step which makes the operation complicated. In order to solve this problem, various wafer sticking adhesive sheets were proposed which combine a wafer fixing function with a semiconductor element sticking function (e.g., JP-B-1987034, JP-A-H08-239636, JP-A-H10-8001, JP-A-2002-212522 and JP-A-2004-43760). These sheets are adhesive bonding tapes having an adhesive bonding layer which satisfies the role of an adhesive film and the role of a dicing tape in one layer. These sheets permits so-called direct die-bonding wherein, after the dicing step, the semiconductor element is picked up with the adhesive layer remaining on the back surface of the chip, and curing/sticking is performed by heating or the like. Hence, it is possible to omit the adhesive coating step.

DISCLOSURE OF THE INVENTION

Problem to be Solved by the Invention

However, the adhesion sheets which are described in for example JP-B-1987034 and JP-A-H08-239636 do not exhibit superior thermal resistance in the cured material, and there was room for better reliability, e.g., thermal resistance, after assembly of the semiconductor package.

An adhesive sheet which is described for example in JP-B-1987034, JP-A-H08-239636 and JP-A-H10-8001 includes a heat-activated latent epoxy resin curing agent in order to improve storage stability. However, as the curing agent is hygroscopic, curing is accelerated by moisture which reduces the usable time, so care was still required regarding storage conditions.

Further, in the adhesive sheets disclosed in for example JP-A-H10-8001, JP-A-2002-212522 and JP-A 2004-43760, various photoreactive monomers are used to cure the adhesive bonding layer by light irradiation and reduce the adhesive force with the semiconductor wafer. But since the photoreactive monomers have only low thermal resistance after ultraviolet light irradiation, there was room for improving adhesive force (tackiness during heating) during heating and reflow resistance.

Thus, the traditional adhesive sheet contributes to simplification of the semiconductor device manufacturing process, however, it is still lacking sufficient adhesive properties with good reflow resistance under the stringent moisture and heating conditions (e.g., 85° C., 85% RH, 168 hours) required in semiconductor packages.

It is therefore an object of the present invention, which was conceived in view of the aforesaid problems, to provide an adhesive bonding sheet which sufficiently functions as a dicing tape in a dicing step, and has an excellent join reliability in a step which joins a semiconductor element to a supporting member. It is a further object of the present invention to provide an adhesive bonding sheet having the thermal resistance and moisture resistance required when mounting a semiconductor element having a large difference of thermal expansion coefficient on a supporting member for semiconductor element mounting, and excellent operability. It is yet another object of the present invention to provide a manufacturing method which can simplify a semiconductor device manufacturing process.

Means for Solving the Problem

The present invention therefore relates to:
1. An adhesive bonding sheet having an optically transmitting supporting substrate and an adhesive bonding layer, and being used in both a dicing step and a semiconductor element adhesion step, wherein the adhesive bonding layer comprises:
   a polymer component (A) having a weight average molecular weight of 100,000 or more including functional groups;
   an epoxy resin (B);
   a phenolic epoxy resin curing agent (C);
   a photoreactive monomer (D), wherein the Tg of the cured material obtained by ultraviolet light irradiation is 250° C. or more; and
   a photoinitiator (E) which generates a base and a radical by irradiation with ultraviolet light of wavelength 200-450 nm.
2. The aforesaid adhesive bonding sheet wherein the polymer component (A) having a weight average molecular weight of 100,000 or more including functional groups is a (meth)acrylic copolymer comprising 0.5-6 weight % of epoxy group-containing repeating unit based on the total weight of the polymer component.
3. The aforesaid adhesive bonding sheet, comprising:
   100 weight parts of the polymer component (A) having a weight average molecular weight of 100,000 or more including functional groups, 5-250 weight parts of the epoxy resin (B), the phenolic epoxy resin curing agent (C), wherein the equivalence ratio of phenolic hydroxyl groups in the phenolic epoxy resin curing agent (C) per epoxy group in the epoxy resin (B) lies within the range of 0.5-1.5, 5-100 weight parts of the photoreactive monomer (D), wherein the Tg of the cured material obtained by ultraviolet light irradiation is 250° C. or more, and 0.1-20 weight parts of the photoinitiator (E) which generates a base and a radical by irradiation with ultraviolet light of wavelength 200-450 nm.
4. The aforesaid adhesive bonding sheet wherein the surface free energy of the supporting substrate is 50 mN/m or less.
5. The aforesaid adhesive bonding sheet wherein the elastic modulus of the supporting substrate at 25° C. is 1000 MPa or less.
6. The aforesaid adhesive bonding sheet wherein the yield elongation of the supporting substrate at room temperature is 20% or more.
7. The aforesaid adhesive bonding sheet wherein the 90° peel adhesion strength after ultraviolet irradiation of the adhesive bonding layer relative to the supporting substrate is 10 N/m or less.
8. The aforesaid adhesive bonding sheet wherein the tack strength of the adhesive bonding layer at 25° C. is 15 gf or more.
9. The aforesaid adhesive bonding sheet wherein the supporting substrate satisfies the conditions expressed by the following equation (a):

$$T1 \times \alpha 1 - T2 \times \alpha 2 \leq 7000 \text{ ppm} \tag{a}$$

where T1 is transfer temperature when manufacturing adhesive bonding sheet, $\alpha 1$ is linear expansion coefficient at the transfer temperature, T2 is room temperature and $\alpha 2$ is linear expansion coefficient at room temperature.

10. A semiconductor device wherein a semiconductor element and a supporting substrate for semiconductor mounting are adhered together by using the aforesaid adhesive bonding sheet.
11. A method of manufacturing a semiconductor device, comprising steps of:
(1) affixing the aforesaid adhesive bonding sheet having the supporting substrate and the adhesive bonding layer to a semiconductor wafer via aforesaid adhesive bonding layer,
(2) forming a chip with said adhesive bonding layer by dicing the semiconductor wafer,
(3) forming a semiconductor element with a curing adhesive bonding layer by irradiating said adhesive bonding layer of the chip with said adhesive bonding layer with ultraviolet light, and peeling said supporting substrate away from said semiconductor element with adhesive bonding layer; and
(4) adhering said semiconductor element with adhesive bonding layer after peeling said supporting substrate to the supporting member for mounting the semiconductor element via said adhesive bonding layer.

EFFECTS OF THE INVENTION

Since the photo-curing adhesive bonding sheet of the present invention has the aforesaid structure, it has superior room temperature sticking properties, dicing properties and reflow cracking resistance, so it is suitable for use as an adhesive resin for fixing electronic materials.

EXPLANATION OF REFERENCE NUMERALS

1: adhesive bonding sheet; 2: supporting substrate; 3: adhesive bonding layer; 4: protective film; 5: edge part; 6: liquid sample (water and methylene iodide); 7: measuring sample; 8: ring; 9: semiconductor wafer; 10: dicing saw; 11: suction collet; 12: semiconductor element mounting supporting substrate; 13: seal material; 14: solder ball; 15: wire bond; 16: semiconductor device; 17: probe; 91, 92, 93: semiconductor element; A: semiconductor wafer; θ: contact angle.

BEST MODES FOR CARRYING OUT THE INVENTION

Figure 1:
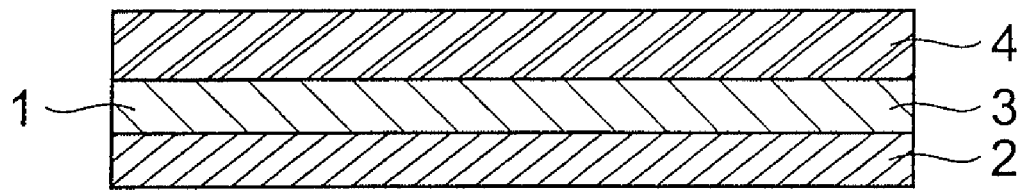
FIG. 1 is a schematic cross-sectional view showing an adhesive bonding sheet according to the present invention.
Figure 2:
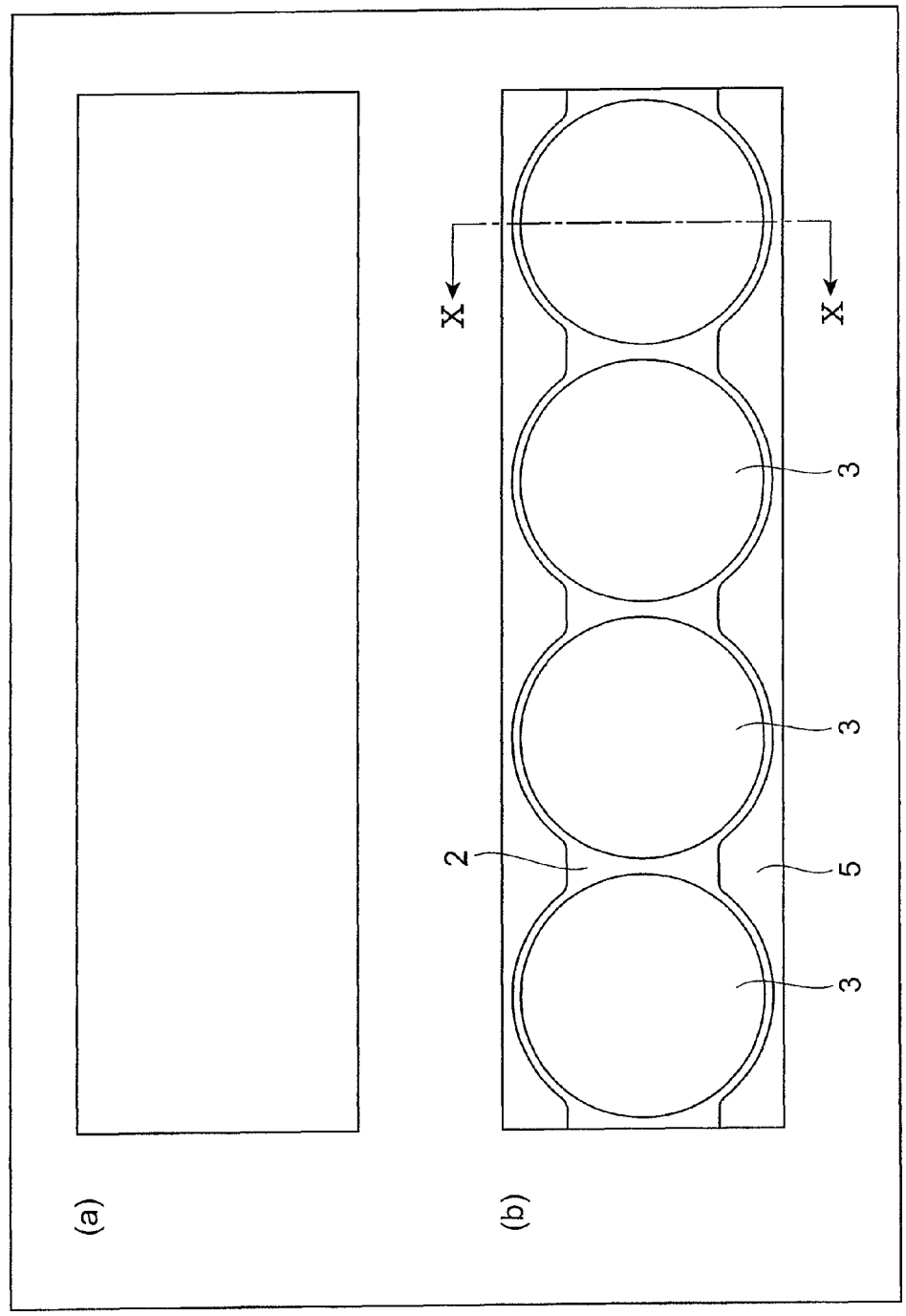
FIG. 2 is an upper surface view showing one example of the adhesive bonding sheet according to the present invention.

An adhesive bonding sheet 1 according to the present invention has a structure wherein an adhesive bonding layer 3 is provided on an optically transparent supporting substrate 2 as shown in FIG. 1, and the adhesive bonding layer being further laminated with a protective film 4 if required. FIG. 2 is an upper surface view showing one example of the adhesive bonding sheet of the present invention. The adhesive bonding layer may be provided on the whole of the supporting substrate as shown in (a) of FIG. 2, or the adhesive bonding layer may first be cut to the shape of a semiconductor wafer to which it is to be stuck as shown in (b) of FIG. 2 (in FIG. 2, the protective film is not shown).

Figure 3:
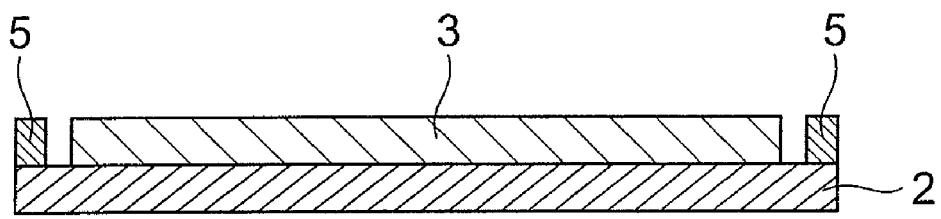
FIG. 3 is a cross-sectional view through a line X-X in (b) of FIG. 2.

FIG. 3 is a cross-sectional view through a line X-X in (b) of FIG. 2. In these figures, plural adhesive bonding layers 3 are precut to a size slightly larger than the semiconductor wafer before lamination on the rectangular supporting substrate 2. An edge part 5 is a thickness adjusting part which is provided so that, when such a rectangular adhesive bonding sheet is wound on a roller or the like, the center part of the sheet with the adhesive bonding layer is prevented from swelling up. The thickness adjusting part may comprise an identical material to that of the adhesive bonding layer 3, may be laminated to form a very thin layer on the adhesive bonding layer 3, or may be formed of a completely different material.

In the case of such a rectangular sheet, the width of the adhesive bonding sheet is not particularly limited provided that the semiconductor wafer can be affixed to it. But it is preferably wider than an 8 inch wafer or 12 inch wafer by 1-10 cm and more preferably 3-8 cm from the viewpoint of operability and productivity. The length of the adhesive bonding sheet may be freely set depending on the dicing device and the like. But if it is too short, replacement becomes difficult, whereas if it is too long, the adhesive bonding sheet in the center part of the roller becomes squeezed which may give rise to thickness and shape deformations. Therefore, it is preferably normally of the order of 10 m-200 m and more preferably 30-70 m.

In the adhesive bonding sheet of the present invention, the adhesive bonding layer comprises, for example, a polymer component (A) having a weight average molecular weight of 100,000 or more including functional groups, an epoxy resin (B), a phenolic epoxy resin curing agent (C), a photoreactive monomer (D), wherein the Tg of the cured material obtained by ultraviolet light irradiation is 250° C. or more, and a photoinitiator (E) which generates a base and a radical by irradiation with ultraviolet light of wavelength 200-450 nm. Hereafter, in the context of the present application, these components may be abbreviated as polymer component (A), epoxy resin (B), epoxy resin curing agent (C), photoreactive monomer (D) and photoinitiator (E), or simply as component (A), component (B), component (C), component (D) and component (E).

It is suggested that the reasons why the aforesaid adhesive bonding sheet can resolve the above problems are as follows.

(1) Because the polymer component (A) having a weight average molecular weight of 100,000 or more including functional groups and the epoxy resin (B) are not miscible with each other, and tend to form a so-called sea-island structure, thus, low elasticity, adhesive properties, operability and high temperature reliability can be obtained.

(2) Because by using both of the phenolic epoxy resin curing agent (C) and the photoreactive monomer (D), wherein the Tg of the cured material obtained by ultraviolet light irradiation is 250° C. or more, superior thermal resistance and reflow resistance can be obtained.

(3) Because the film which have both reactivity and superior storage stability can be obtained. In other words, due to the use of the photoinitiator (E) which generates a base and a radical by irradiation with ultraviolet light of wavelength 200-450 nm in the presence of the phenolic epoxy resin curing agent (C) and the photoreactive monomer (D), wherein the Tg of the cured material obtained by ultraviolet light irradiation is 250° C. or more, when light is not irradiated, the epoxy resin and photoreactive monomer hardly react together and superior storage stability can be obtained. On the other hand, if light is irradiated, a photo-reaction of the photoreactive monomer (D) is accelerated, and an epoxy resin curing accelerator generates, thus, curing reaction of the epoxy resin proceeds smoothly when heated in this condition.

Hereafter, the components will be described in more detail.

From the viewpoint of adhesion improvement, the polymer component (A) having a weight average molecular weight of 100,000 or more including functional groups preferably contains a functional group such as epoxy (for example, glycidyl), acryloyl, methacryloyl, carboxyl, hydroxyl or episulfide, and among these, from the viewpoint of cross-linking properties, glycidyl is preferred. Specifically, the component (A) may be a (meth)acrylic copolymer containing glycidyl group having a weight average molecular weight of 100,000 or more, which is copolymerized using glycidyl acrylate or glycidyl methacrylate as a starting material monomer. From the viewpoint of reflow resistance, the component (A) is preferably immiscible with the epoxy resin. However, miscibility is determined not only by the properties of the polymer component (A), so a combination is selected wherein the two moieties are immiscible. In the present invention, the aforesaid glycidyl group-containing (meth)acrylic copolymer denotes both a glycidyl group-containing acrylic copolymer and a glycidyl group-containing methacrylic copolymer.

Such a copolymer may be, for example, a (meth)acrylic ester copolymer or an acrylic rubber, and an acrylic rubber is more preferred. Acrylic rubber has an acrylic acid ester as its main component, and it is a rubber mainly comprising a copolymer of butyl acrylate and acrylonitrile, or a copolymer of ethyl acrylate and acrylonitrile. The copolymer monomer may, for example, be butyl acrylate, methyl acrylate, ethyl acrylate, methyl methacrylate, ethyl methacrylate or acrylonitrile.

If a glycidyl group is selected as a functional group, glycidyl acrylate or glycidyl methacrylate is preferably used as the copolymer monomer component. Such a glycidyl group-containing (meth)acrylic copolymer having a weight average molecular weight of 100,000 or more can be manufactured by selecting a suitable monomer from the aforesaid monomers, or a commercial product (e.g., Nagase ChemteX HTR-860P-3, HTR-860P-5) can also be used.

In the polymer component (A) having a weight average molecular weight of 100,000 or more including functional groups, the number of functional groups are important, because it affects the cross-linking degree, and differs depending on the resin used. For example, if the polymer component is obtained as a copolymer of plural monomers, the amount of functional group-containing monomers used as starting materials is preferably of the order of 0.5-6.0 weight %, based on the total amount of the copolymer.

If a glycidyl group-containing acrylic copolymer is used as component (A), the amount of glycidyl group-containing monomer (in the context of the present application, it is synonymous with the amount of glycidyl group-containing repeating unit and the amount of epoxy group-containing repeating unit) such as glycidyl acrylate or glycidyl methacrylate used as starting materials is preferably 0.5-6.0 weight %, more preferably 0.5-5.0 weight % and still more preferably 0.8-5.0 weight % of the copolymer, based on the total amount of the copolymer. If the amount of glycidyl group-containing monomer is within this range, smooth cross-linking of the glycidyl groups take place, thus tackiness can be maintained while gelling can be prevented. Also, since it is immiscible with the epoxy resin (B), it has excellent stress mitigation properties.

If a glycidyl group-containing acrylic copolymer is synthesized, other functional groups may be introduced into the glycidyl acrylate or glycidyl methyl acrylate to be used as the monomer. The mixing ratio in this case is determined by taking account of the glass transition temperature (hereafter, "Tg") of the glycidyl group-containing (meth)acrylic copolymer, Tg preferably being −10° C. or more. If Tg is −10° C. or more, the tackiness of the adhesive bonding layer in B-stage is satisfactory and there are no problems regarding handling.

When the polymer component (A) having a weight average molecular weight of 100,000 or more including functional groups is a glycidyl group-containing acrylic copolymer obtained by polymerizing the aforesaid monomers, the polymerization method is not particularly limited, and may be for example a method such as pearl polymerization or solution polymerization.

In the present invention, the weight average molecular weight of the polymer component (A) is 100,000 or more, but preferably 300,000-3,000,000, more preferably 400,000-2.500,000 and still more preferably 500,000-2,000,000. If the weight average molecular weight is within this range, suitable strength, flexibility and tackiness are obtained when the material is fashioned into a sheet or film, and since flow properties are satisfactory, circuit filling properties of the wiring can be maintained. In the present invention, the weight average molecular weight is measured by gel permeation chromatography and is a value obtained by conversion using a standard polystyrene calibration curve.

The epoxy resin (B) used in the present invention is not particularly limited provided that it cures and sticks, and for example any of the epoxy resins listed in the Epoxy Resin Handbook (Masaki Shinpo, Nikkan Kogyo Shimbun) may be used. Specific examples are bifunctional epoxy resins such as bisphenol A epoxy, and novolak epoxy resins such as phenol novolak epoxy resin and cresol novolak epoxy resin. Other resins known in the art such as polyfunctional epoxy resins, glycidyl amine epoxy resins, heterocyclic ring-containing epoxy resins and aliphatic epoxy resins may also be used.

Examples of bisphenol A type epoxy resins are Japan Epoxy Resins Co., Ltd. Epicoat 807, 815, 825, 827, 828, 834, 1001, 1004, 1007, 1009, Dow Chemicals DER-330, 301, 361 and Toto Kasei Co., Ltd. YD8125, YDF8170. Examples of phenol novolak type epoxy resins are Japan Epoxy Resins Co., Ltd., Epicoat 152, 154, Nippon Kayaku Co., Ltd., EPPN-201 and Dow Chemical DEN-438. Examples of o-cresol novolak type epoxy resins are Nippon Kayaku Co., Ltd. EOCN-102S, 103S, 104S, 1012, 1025, 1027 and Toto Kasei Co., Ltd. YDCN701, 702, 703, 704. Examples of polyfunctional epoxy resins are Japan Epoxy Resins Co., Ltd. Epon1031S, Ciba Specialty Chemicals Co., Ltd. Araldite 0163 and Nagase Chemical Co., Ltd. Denacol EX-611, 614, 614B, 622, 512, 521, 421, 411, 321. Examples of amine type epoxy resins are Japan Epoxy Resins Co., Ltd. Epicoat 604, Toto Kasei Co., Ltd. YH-434, Mitsubishi Gas Chemicals Co., Ltd. TETRAD-X, TETRAD-C and Sumitomo Chemicals, Ltd. ELM-120. Examples of heterocyclic ring-containing epoxy resins are Ciba Specialty Chemicals Co., Ltd. Araldite PT810 and UCC ERL4234, 4299, 4221, 4206. These epoxy resins may be used alone, or two or more may be used together.

In the context of the present invention, for the purpose of conferring high tackiness. Using bisphenol A type epoxy resin and phenol novolak type epoxide resin as the epoxy resin (B) is preferred.

The usage amount of the epoxy resin (B) of the present invention is preferably 5-250 weight parts relative to 100 weight parts of the polymer component (A) having a weight average molecular weight of 100,000 or more including functional groups. If the usage amount of the epoxy resin (B) is within this range, the elastic modulus and suppression of flow properties during molding can be ensured, and high temperature ease of handling is also sufficient. The usage amount of the epoxy resin (B) is more preferably 10-100 weight parts, and still more preferably 20-50 weight parts.

As described above, the epoxy resin (B) is preferably immiscible with the polymer component (A).

The phenolic epoxy resin curing agent (C) used in the present invention, when used for an adhesive bonding layer combined with an epoxy resin, has excellent impact resistance at high temperature and high pressure, and effectively maintains adhesion physical properties even under severe heat and moisture absorption conditions.

Examples of the component (C) are a phenolic resin such as phenol novolak resin, bisphenol A novolak resin or cresol novolak resin. More specific examples are Dai Nippon Ink & Chemicals, Inc. Phenolite brand name: LF 2882, Phenolite LF 2822, Phenolite TD-2090, Phenolite TD-2149, Phenolite VH-4150 and Phenolite VH4170. These may be used alone, or two or more may be used together.

In the present invention, to confer electrocorrosion resistance when moisture is absorbed, the usage amount of component (C) is preferably such that the equivalence ratio of phenolic hydroxyl groups in the phenolic epoxy resin curing agent (C) per epoxy groups in the epoxy resin (B) is within the range of 0.5-1.5, and more preferably such that this equivalence ratio is 0.8-1.2. If this equivalence ratio is too large, or even if it is too small, curing (crosslinking) of the resin becomes insufficient, thus the glass transition temperature does not increase. Consequently, moisture resistance and high temperature electrical properties tend to deteriorate.

In the adhesive bonding sheet of the present invention, if a photoreactive monomer (D), wherein the Tg of the cured product obtained by ultraviolet light irradiation is 250° C. or more is used, thermal resistance after ultraviolet light irradiation is high, thus tackiness and reflow resistance during heating becomes satisfactory. The Tg of component (D) is measured as follows. First, a photoinitiator is added to component (D), and the cured product obtained by ultraviolet light irradiation is molded into a rectangle having a size of about 5×5 mm to manufacture a sample. The manufactured sample is measured by the compression mode of a Seiko Instruments Ltd. (brand name: EXSTRA 6000) to determine Tg. If Tg is 250° C. or more, the thermal resistance of the adhesive bonding layer becomes excellent, and the sample can withstand a temperature of 250° C. or more in the reflow cracking resistance test. Therefore, reflow cracking resistance is satisfactory. From this viewpoint of this, Tg of the cured product of the component (D) is preferably 200° C. or more, and more preferably 250° C. or more. Still more preferably, the sample should be able to withstand lead-free solder of 260° C. or more. However, if Tg is too high, the sticking properties of the adhesive bonding sheet at room temperature after ultraviolet light irradiation tend to deteriorate, thus the upper limit is preferably of the order of 350° C.

Specific examples of component (D) are polyfunctional acrylates such as pentaerythritol triacrylate, dipentaerythritol hexacrylate, dipentaerythritol pentacrylate, trimethylol propane triacrylate, isocyanic acid ethylene oxide-modified triacrylate, ditrimethylol propane tetracrylate and pentaerythritol tetracrylate. These photoreactive monomers may be used alone, or two or more may be used together. From the viewpoint of residual monomer after ultraviolet light irradiation, among polyfunctional moieties, dipentaerythritol hexacrylate or dipentaerythritol pentacrylate are preferred. Specific examples are Shin-Nakamura Chemicals: A-DPH, A-9300.

If plural kind of components (D) are used, the Tg is the Tg of the mixture which is measured by the aforesaid measurement method, and it is unnecessary that the Tg of the respective monomers is 250° C. or more.

The usage amount of the photoreactive monomer (D) of the present invention, wherein Tg of the cured product obtained by ultraviolet light irradiation is 250° C. or more, is preferably 5-100 weight parts relative to 100 weight parts of the polymer component (A) having a weight average molecular weight of 100,000 or more including functional groups. If the blending proportion is 5 weight parts or more, the polymerization reaction of the photoreactive monomer due to ultraviolet light irradiation occurs easily, thus pickup properties tend to be enhanced. On the other hand, if it is larger than 100 weight parts, the low elasticity of the polymer component no longer functions, the film becomes brittle, and moisture resistance and high temperature electrical properties tend to deteriorate. From the same view point, the usage amount of component (D) is more preferably 10-70 weight parts, but still more preferably 20-50 weight parts relative to 100 weight parts of the component (A).

The photoinitiator (E) which generates a base and a radical by irradiation with ultraviolet light of wavelength 200-450 nm of the present invention which generates a base and radicals due to irradiation by ultraviolet light of wavelength 200-450 nm is generally referred to as an α-aminoketone compound. This type of compound is disclosed for example in J. Photopolym. Sci. Technol. Vol. 13, No. 12001, and it reacts as follows when irradiated with ultraviolet light:

[Chemical Formula 1]

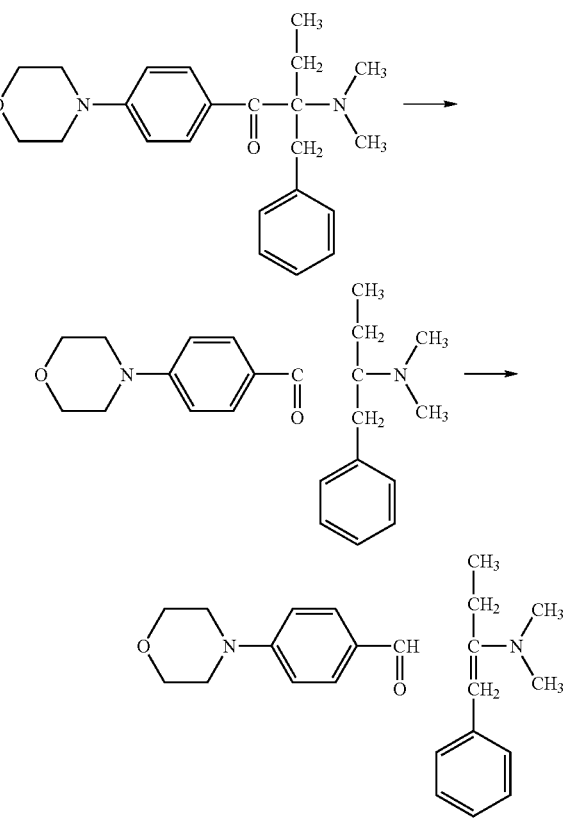

Prior to ultraviolet light irradiation, there are no radicals present from the α-aminoketone compound, thus a polymerization reaction of the photoreactive monomer does not occur. Also, due to steric hindrance, curing of the thermosetting resin is not accelerated. However, when ultraviolet light irradiation is performed, the α-aminoketone compound dissociates, and due to the generation of radicals, a polymerization reaction of the photoreactive monomer then occurs. Moreover, due to dissociation of the α-aminoketone compound, steric hindrance decreased and activated amine is produced. Therefore, it may be conjectured that this amine accelerates the curing of the thermosetting resin, and that this curing is accelerated by subsequent heating. Due to this effect, since radicals or active amines are hardly present prior to ultraviolet light irradiation, an adhesive bonding sheet having excellent storage stability at room temperature can be provided. The curing rate of the photoreactive monomer or epoxy resin changes depending on the structure of the radicals and the amine produced by ultraviolet light irradiation, thus the photobase generating agent (E) can be determined according to the species of component (B), component (C) and component (D).

The photo base-generating agent (E) may for example be 2-methyl-1-[4-(methylthio)phenyl]-2-morpholinopropane-1-one (Ciba Specialty Chemicals Co., Ltd., Irgacure 907), 2-benzyl-dimethylamino-1-(4-morpholinophenyl)-butanone-1-one (Ciba Specialty Chemicals Co., Ltd., Irgacure 369), hexaryl-bisimidazole derivative (a substituent group such as halogen, alkoxy, nitro or cyano may be substituted by phenyl group), or a benzoisoxazolone derivative.

In addition to the aforesaid base generating agent, a method may be used which generates a base by photo-Fries rearrangement, photo-Claisen rearrangement or Curtius rearrangement, or Stevens rearrangement.

The aforesaid base generating agent may be used as a low molecular weight compound having a molecular weight of 500 or less, or a compound introduced into a polymer main chain and side chain. In this case, from the viewpoint of adhesive bonding property and fluidity of the adhesive agent, the molecular weight is preferably a weight average molecular weight of 1000-100,000, but more preferably 5000-30,000.

In the adhesive bonding sheet of the present invention, the usage amount of the photobase generating agent (E) is preferably 0.1-20 weight parts relative to 100 weight parts of the polymer component (A) having a weight average molecular weight of 100,000 or more including functional groups. If it is less than 0.1 weight parts, reactivity becomes poor and unreacted monomer may remain, whereas if it exceeds 20 weight parts, since the molecular weight increase due to the polymerization reaction does not function well, and a large amount of low molecular weight components remain, reflow resistance may be affected. Therefore, the usage amount of component (E) is more preferably 0.5-15 weight parts, and still more preferably 1-5 weight parts.

Next, other components which may be contained in the adhesive bonding layer in addition to the aforesaid component (A)-(E) will be described. To improve flexibility and reflow cracking resistance, a polymer resin (F) which is miscible with the epoxy resin may be added to the adhesive bonding layer which forms the adhesive bonding sheet of the present invention. From the viewpoint that substances which are not miscible with the polymer component (A) improve reliability, such a polymer resin may be for example a phenoxy resin, high molecular weight epoxy resin or super high molecular weight epoxy resin. These may be used alone, or two or more may be used together. When a substance which is miscible with the polymer component (A) is used as the epoxy resin (B), if a polymer resin which is miscible with the epoxy resin (F) is used, the epoxy resin (B) then becomes more miscible with component (F), so as a result, it may be possible to make the epoxy resin (B) and polymer component (A) immiscible.

The usage amount of polymer resin which is miscible with the epoxy resin is preferably 40 weight parts or less relative to a total of 100 weight parts of epoxy resin and phenolic epoxy resin curing agent. Within this range, Tg of the epoxy resin layer can be ensured.

To improve handling, enhance thermal conductivity, adjust melt viscosity and impart thixotropic properties, an inorganic filler may also be added to the adhesive bonding layer forming the adhesive bonding sheet of the present invention. This inorganic filler is not particularly limited, but may be for example aluminum hydroxide, magnesium hydroxide, calcium carbonate, magnesium carbonate, calcium silicate, magnesium silicate, calcium oxide, magnesium oxide, aluminum oxide, aluminum nitride, aluminum borate whisker, boric nitride, crystalline silica or non-crystalline silica. The shape of the filler is not particularly limited. These fillers may be used alone, or two or more may be used together.

Among these, to enhance thermal conductivity, inorganic fillers such as aluminum oxide, aluminum nitride, boric nitride, crystalline silica and non-crystalline silica are preferred. From the viewpoint of adjusting melt viscosity and imparting thixotropic properties, aluminum hydroxide, magnesium hydroxide, calcium carbonate, magnesium carbonate, calcium silicate, magnesium silicate, calcium oxide, magnesium oxide, aluminum oxide, crystalline silica and non-crystalline silica are preferred. To enhance fluidity when the film is heated, it is more preferable to use a nanofiller.

The usage amount of inorganic filler is preferably 1-40 weight parts relative to 100 weight parts of the adhesive bonding layer. If it is less than 1 weight part, the addition result may not be obtained, and if it is more than 40 weight parts, the storage elastic modulus of the adhesive bonding layer may increase, its adhesive properties may deteriorate, and electrical properties may deteriorate due to the presence of voids.

To improve interface bonding between different materials, various coupling agents may also be added to the adhesive bonding layer forming the adhesive bonding sheet of the present invention. Coupling agent may be for example a silane coupling agent, titanium coupling agent or aluminum coupling agent.

The aforesaid silane coupling agent is not particularly limited, but may be for example γ-methacryloxypropyltrimethoxysilane, γ-methacryloxypropylmethyldimethoxysilane, γ-mercaptopropyltrimethoxysilane, γ-mercaptopropyltriethoxysilane, 3-aminopropyl methyldiethoxysilane, 3-ureidopropyltriethoxysilane and 3-ureidopropyltrimethoxysilane. These may be used alone, or two or more may be used together. Specific examples are Nippon Unica A-189 and A-1160.

From the viewpoint of its effect, thermal resistance and cost, the usage amount of the aforesaid coupling agent is preferably 0.01-10 weight parts relative to 100 weight parts of the polymer component (A) having a weight average molecular weight of 100,000 or more including functional groups.

To improve insulation reliability when moisture is absorbed due to adsorption of ionic impurities, an ion capture agent may further be added to the adhesive bonding layer forming the adhesive bonding sheet of the present invention. This ion capture agent is not particularly limited, and may be for example a triazine thiol compound, a compound known as a copper poisoning prevention agent which prevents copper from ionizing and dissolving out, such as a bisphenol reducing agent, or an inorganic ion capture agent such as a zirconium type compound or antimony bismuth type magnesium aluminum compound.

From the viewpoint of its effect, thermal resistance and cost by addition, the usage amount of the aforesaid ion capture agent is preferably 0.1-10 weight parts relative to 100 weight parts of the polymer component (A) having a weight average molecular weight of 100,000 or more including functional groups.

(Method of Manufacturing Adhesive Bonding Sheet)

The adhesive bonding sheet of the present invention may be obtained by dissolving or dispersing the composition forming the adhesive bonding sheet in a solvent to produce a varnish, coating the varnish on a substrate film, and then heating to remove the solvent.

Figure 4:
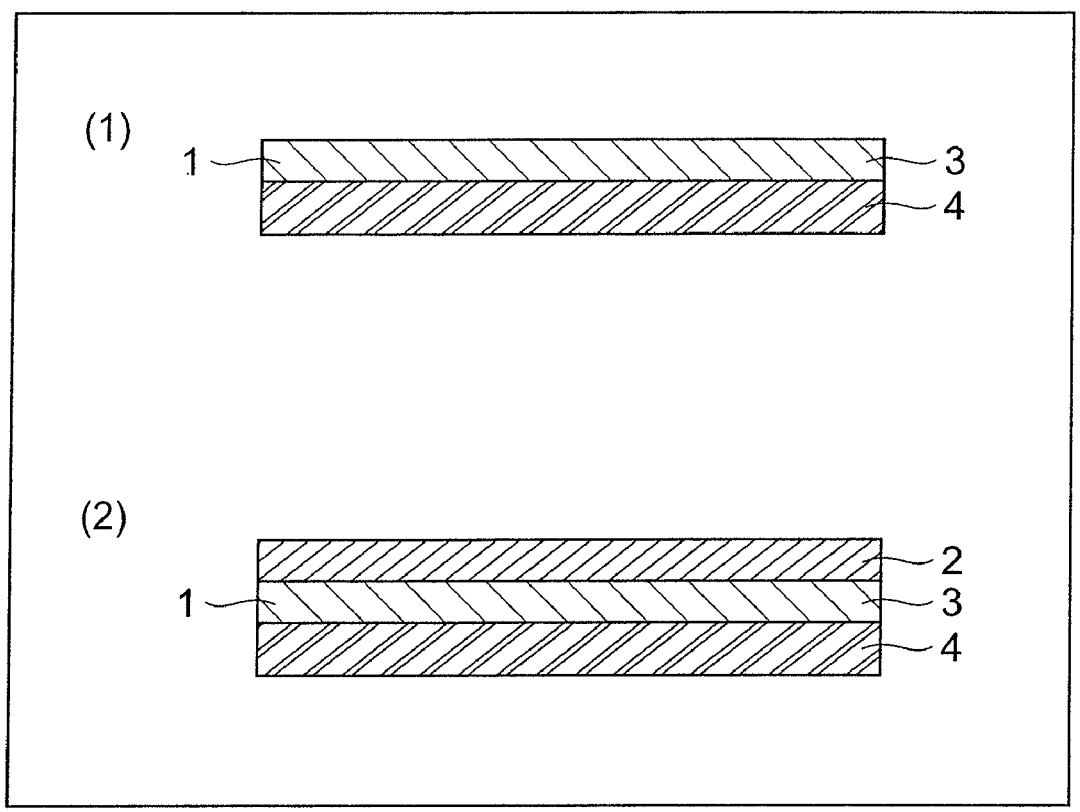
FIG. 4 is a schematic cross-sectional view showing one example of the layer structure of the adhesive bonding sheet of the present invention.

As shown in FIG. 4, a varnish prepared by dissolving the adhesive bonding agent of starting material resin composition, comprising the aforesaid components in an organic solvent or the like, is coated by a method known in the art such as knife coating, roller coating, spray coating, gravure coating, bar coating or curtain coating on the protective film 4 (referred to also as a release sheet), and drying to form the adhesive bonding layer 3. Subsequently, the optically transparent supporting substrate 2 is laminated to obtain the adhesive bonding sheet 1 comprising the release sheet (protective film), adhesive bonding layer and optically transparent supporting substrate. Alternatively, the adhesive bonding layer composition is coated directly on the optically transparent supporting substrate by an identical method and dried, and the protective film is then laminated to obtain the adhesive bonding sheet comprising the protective film, adhesive bonding layer and optically transparent supporting substrate.

The optically transparent supporting substrate used in the adhesive bonding sheet of the present invention may be for example a plastic film such as a polytetrafluoroethylene film, polyethylene film, polypropylene film or polymethylpentene film.

Figure 5:
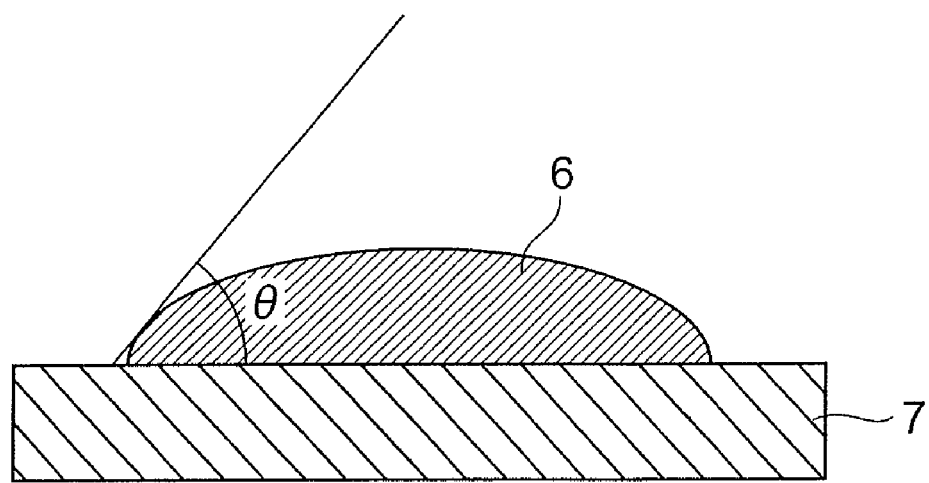
FIG. 5 is a schematic cross-sectional view showing a method of measuring a contact angle.

From the viewpoint of adhesive force between the supporting substrate and adhesive bonding layer, the optically transparent supporting substrate used in the adhesive bonding sheet of the present invention preferably has a surface free energy of 20-50 mN/m, and more preferably 30-45 mN/m. If this surface free energy is less than 20 mN/m, the adhesive force at the interface between the optically transparent supporting substrate and adhesive bonding layer goes down, and when the protective film is removed, part of the adhesive bonding layer may be detached from the supporting substrate. Alternatively, if it is more than 50 mN/m, a peeling strength difference between supporting substrate/adhesive bonding layer and adhesive bonding layer/protective film after exposure may not easily be manifested, the wafer fixing strength may be too large and pickup properties may be impaired. In the present invention, the surface free energy is a value computed from the following equations (1)-(3) from the measured value (refer to FIG. 5) of the contact angle θ relative to a liquid sample 6 (water and methylene iodide) for a measurement sample 7 obtained by using Kyowa Surface Chemicals Ltd. CA-Z.

$$72.8(1+\cos\theta 1)=[(21.8)^{1/2} \cdot (\gamma^d)^{1/2}+(51.0)^{1/2} \cdot (\gamma^p)^{1/2}] \quad (1)$$

$$50.8(1+\cos\theta 2)=[(48.5)^{1/2} \cdot (\gamma^d)^{1/2}+(2.3)^{1/2} \cdot (\gamma^p)^{1/2}] \quad (2)$$

$$\gamma=\gamma^d+\gamma^p \quad (3)$$

(in the equations, θ1 is a contact angle (deg) relative to water, θ2 is a contact angle relative to methylene iodide, γ is a surface free energy, $\gamma^d$ is a dispersion component of the surface free energy, and $\gamma^p$ is a polarity component of the surface free energy).

Figure 6:
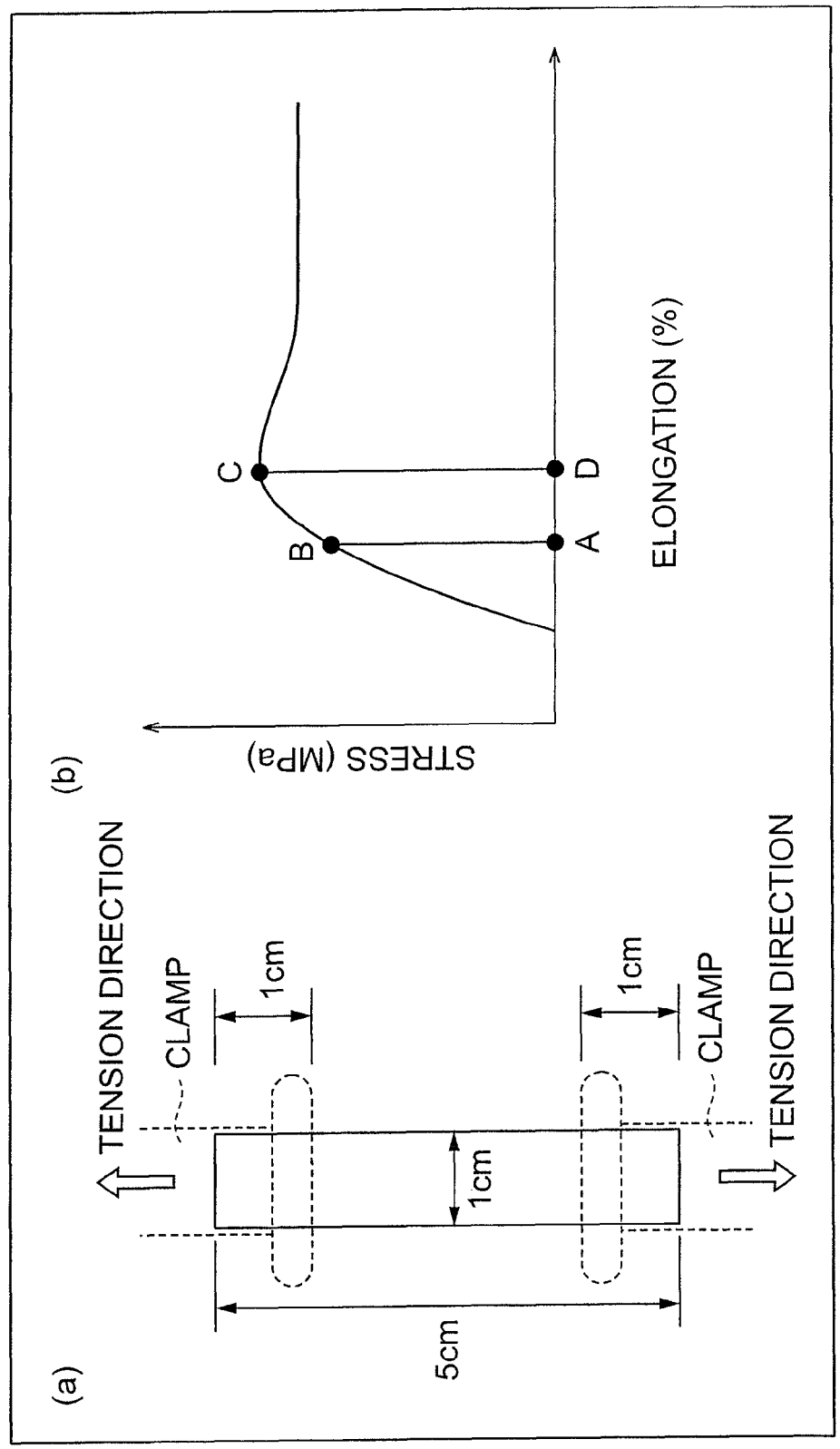
FIG. 6 is a schematic view showing a method of measuring an elastic modulus, and a graph showing a method of defining a yield elongation.
Figure 7:
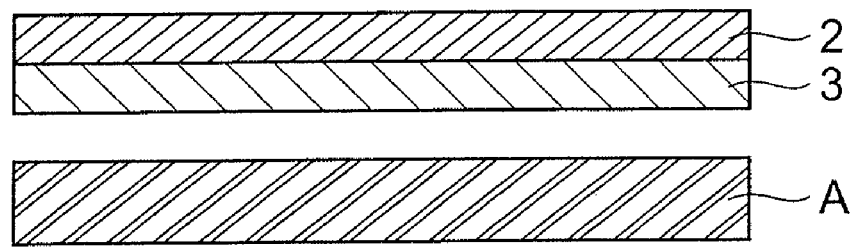
FIG. 7 is a schematic cross-sectional view showing how the adhesive bonding sheet of the present invention is laminated onto a wafer.

From the viewpoint of improving pickup properties, dicing properties and transfer properties, the optically transparent supporting substrate used in the adhesive bonding sheet of the present invention preferably has an elastic modulus at 25° C. of 10-2000 MPa. If it is less than 10 MPa, the performance of the supporting substrate cannot be maintained, and if it is more than 2000 MPa, transfer tends to be poor, so subsequent pickup properties may be affected. From the viewpoint of dicing properties, aforesaid elastic modulus is more preferably 50-1000 MPa, and still more preferably 100-500 MPa. In the present invention, the elastic modulus of the optically transparent supporting substrate at 25° C. is determined as follows. First, a rectangular film of sample size 1 cm×5 cm is fixed at intervals of 1 cm on both sides using an Orientech Co., Ltd. Tensilon, and a tensile strength measurement is performed at a measurement speed of 100 mm/minute (see (a) of FIG. 6.). Using measuring result of horizontal axis: elongation/ %, vs. vertical axis: stress/MPa (see (b) of FIG. 6), the slope of the line joining the point where the sample begins to elongate and the stress (the point B) corresponding to the point A of 1 mm elongation (3.3%) is taken as the elastic modulus of the supporting substrate.

The yield elongation of the optically transparent supporting substrate used for the adhesive bonding sheet of the present invention should be considered for smooth expansion. Yield elongation is a tensile property which expresses the degree of elongation at the yield point as a percentage. The value of the yield elongation is preferably 5-100% or more, and more preferably 20-80% or more. If the yield elongation is less than 5%, pickup tends to be hindered. In the present invention, the value of the elongation (point D) corresponding to the first peak value (point C) of stress in the aforesaid measurement results for the elastic modulus ((b) of FIG. 6) is taken as the yield elongation of the optically transparent support member.

Considering that the optically transparent supporting substrate used for the adhesive bonding sheet of the present invention may be handled as a sheet, due attention should be paid to its linear expansion coefficient. From the viewpoint of curvature, the linear expansion coefficient of the supporting substrate preferably satisfies the condition expressed by the following equation (a):

$$T1 \times \alpha 1 - T2 \times \alpha 2 < 7000 \text{ (units:ppm)} \quad (a)$$

where T1 is transfer temperature when manufacturing adhesive bonding sheet, α1 is linear expansion coefficient at the transfer temperature, T2 is room temperature and α2 is linear expansion coefficient at room temperature.

If the left-hand side of equation (a) exceeds 7000 ppm, curvature increases too much when the substrate is used as a sheet during handling and handling properties deteriorate. From the same point of view, the left-hand side of equation (a) is more preferably 5000 ppm or less, and still more preferably 3000 ppm or less. In the present invention, the linear expansion coefficients α1, α2 (units: ppm/° C.) are determined by a thermal analysis system of Seiko Instruments (brand name: EXSTRA 6000) using a film of sample size 4 mm×1 cm, in the tension mode, temperature increase rate: 10° C./min, measurement temperature: −20° C. to 180° C. In equation (a), "room temperature" means 25° C.

The solvent used to prepare the aforesaid varnish is not particularly limited provided that it is an organic solvent, and is determined by considering the volatility during film manufacture from the boiling point. As specific examples, to prevent film curing from occurring during film manufacture, relatively low boiling solvents such as methanol, ethanol, 2-methoxyethanol, 2-ethoxyethanol, 2-butoxyethanol, methyl ethyl ketone, acetone, methyl isobutyl ketone, toluene and xylene are preferred. To improve coatability, relatively high boiling solvents such as for example dimethyl acetamide, dimethylformamide, N-methylpyrrolidone and cyclohexanone are preferred. These solvents may be used alone, or two or more may be used together.

To manufacture the varnish when an inorganic filler is added, considering the dispersibility of the inorganic filler, a stone mill, 3-roller mill, ball mill and bead mill are preferably used, or a combination thereof can be used. The mixing time can also be shortened by premixing the inorganic filler and low molecular weight starting material, and then blending the high molecular weight starting material. Further, after the varnish has been prepared, air bubbles in the varnish can be removed by vacuum degassing.

The thickness of the adhesive bonding layer is not particularly limited, but is preferably 3-200 μm. If it is thinner than 3 μm, stress mitigation becomes poor, and if it is thicker than 200 μm, it becomes uneconomical and the requirement to make the semiconductor device more compact cannot be satisfied.

The thickness of the supporting substrate is not particularly limited, but is preferably 5-250 μm. If it is thinner than 5 μm, there is a risk of breaking the supporting substrate when a cut is made in the supporting substrate during dicing, and if it is thicker than 250 μm, it becomes uneconomical.

The total thickness of the adhesive bonding layer and supporting substrate is normally of the order of 10-250 μm. If the supporting substrate has the same or slightly greater thickness than that of the adhesive bonding layer, operability becomes better. Specific combinations of adhesive bonding layer/supporting substrate (μm) are 5/25, 10/30, 10/50, 25/50, 50/50, 50/75, and these may be suitably determined depending on the usage conditions and devices. To obtain the desired thickness, the adhesive bonding sheet of the present invention may also comprise two or more adhesive bonding agent prepared separately which are stuck together on the adhesive bonding layer side of the adhesive bonding sheet so as to improve fluidity during heating. In this case, the sticking conditions must be such that the adhesive bonding layers do not peel away from each other.

When the adhesive bonding sheet having the aforesaid structure is irradiated with ultraviolet light, after ultraviolet light irradiation, the adhesive force between the supporting substrate and the adhesive bonding layer largely decreases, so the adhesive bonding sheet can be easily picked up from the supporting substrate while the adhesive bonding layer is supported on a semiconductor element.

Figure 8:
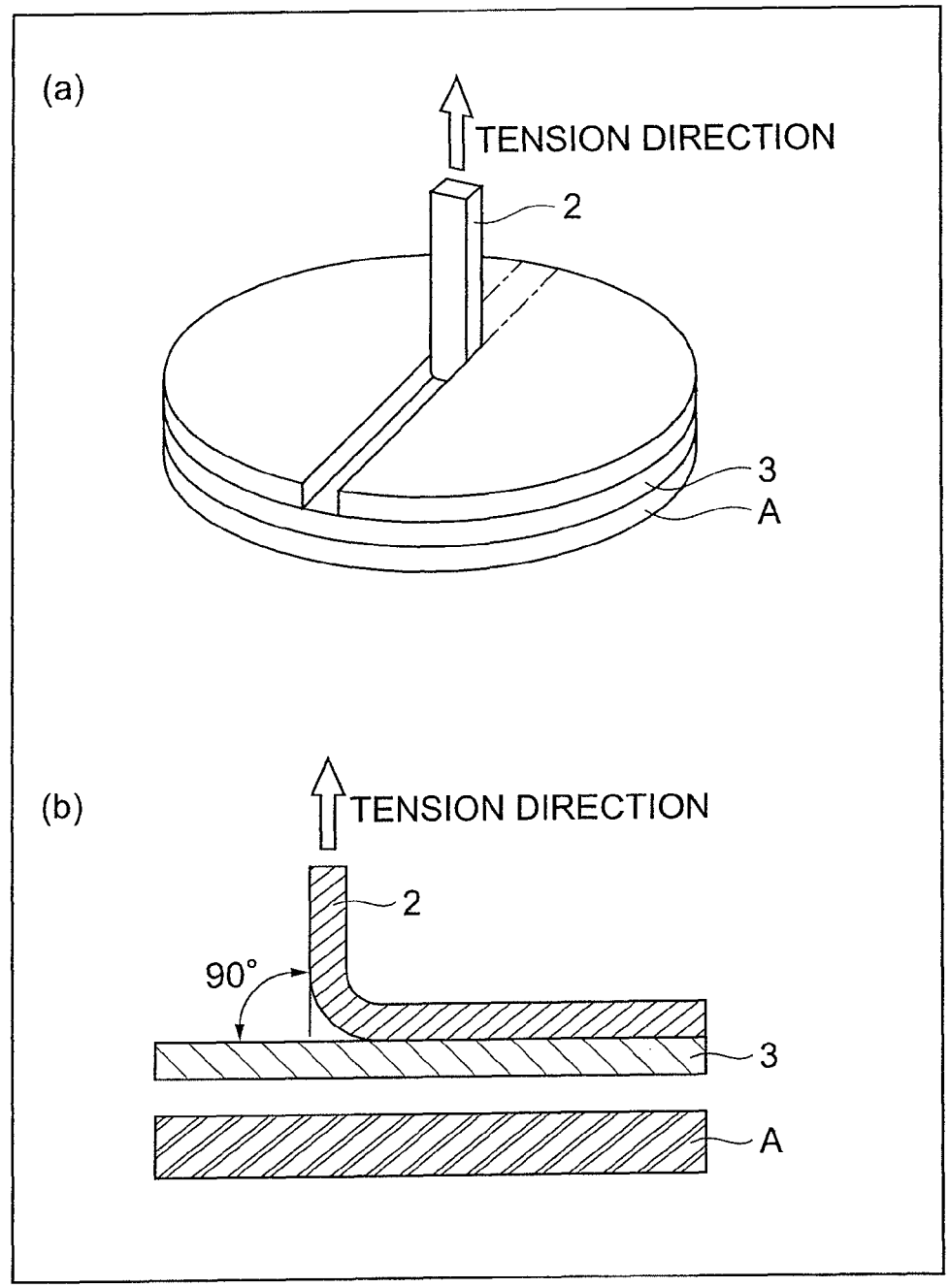
FIG. 8 is a view showing a method of measuring 90° peel strength.

As a simple test for measuring pickup properties in the adhesive bonding sheet of the present invention, a 90° peel adhesion strength measurement can be performed (at a measurement temperature of 25° C.). In the present invention, 90° peel adhesion strength measurement is performed as follows. First, as shown in (a) of FIG. 8, the adhesive bonding sheet 1 is laminated on a wafer A, a cut is made to a width of 1 cm, the substrate 2 is cut and ultraviolet light irradiation is performed. Subsequently, as shown in (b) of FIG. 8, the 90° peel adhesion strength is measured by performing a 90° peel of the adhesive bonding layer/supporting substrate interface at a tension speed of 300 m/minute. From the viewpoint of pickup properties, the peel adhesion strength is preferably 20 N/m or less, and more preferably 10 N/m or less.

Figure 9:
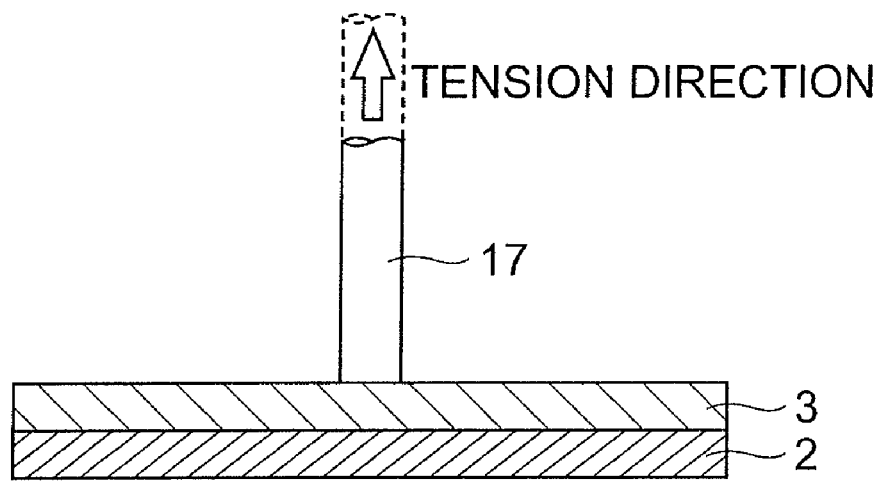
FIG. 9 is a schematic cross-sectional view showing a method of measuring tack load.

As a simple test for measuring room temperature adhesion properties of the adhesive bonding sheet of the present invention, a tack load measurement may be performed (FIG. 9). From the viewpoint of handling and room temperature lamination properties, the tack load is preferably 5-400 gf, and more preferably 10-200 gf. The tack load measurement of the present invention is performed using RHESCA tacking tester under the measurement conditions of probe 17's diameter 5.1 mm, peeling rate 10 mm/sec, contact load 100 gf/$cm^2$, contact time 1 s and at 25° C. according to JIS-Z-0237-1991.

After the adhesive bonding sheet of the present invention has been subjected to a dicing step, the adhesive bonding sheet is irradiated by ultraviolet light (UV) which polymerizes and cures the adhesive bonding sheet having ultraviolet light polymerizing properties, and reduces the adhesive force at the interface between the adhesive bonding sheet and substrate so that pickup of a semiconductor element can be performed. An example of using method for the adhesive bonding sheet according to the present invention will now be described referring to FIG. 10.

Figure 10:
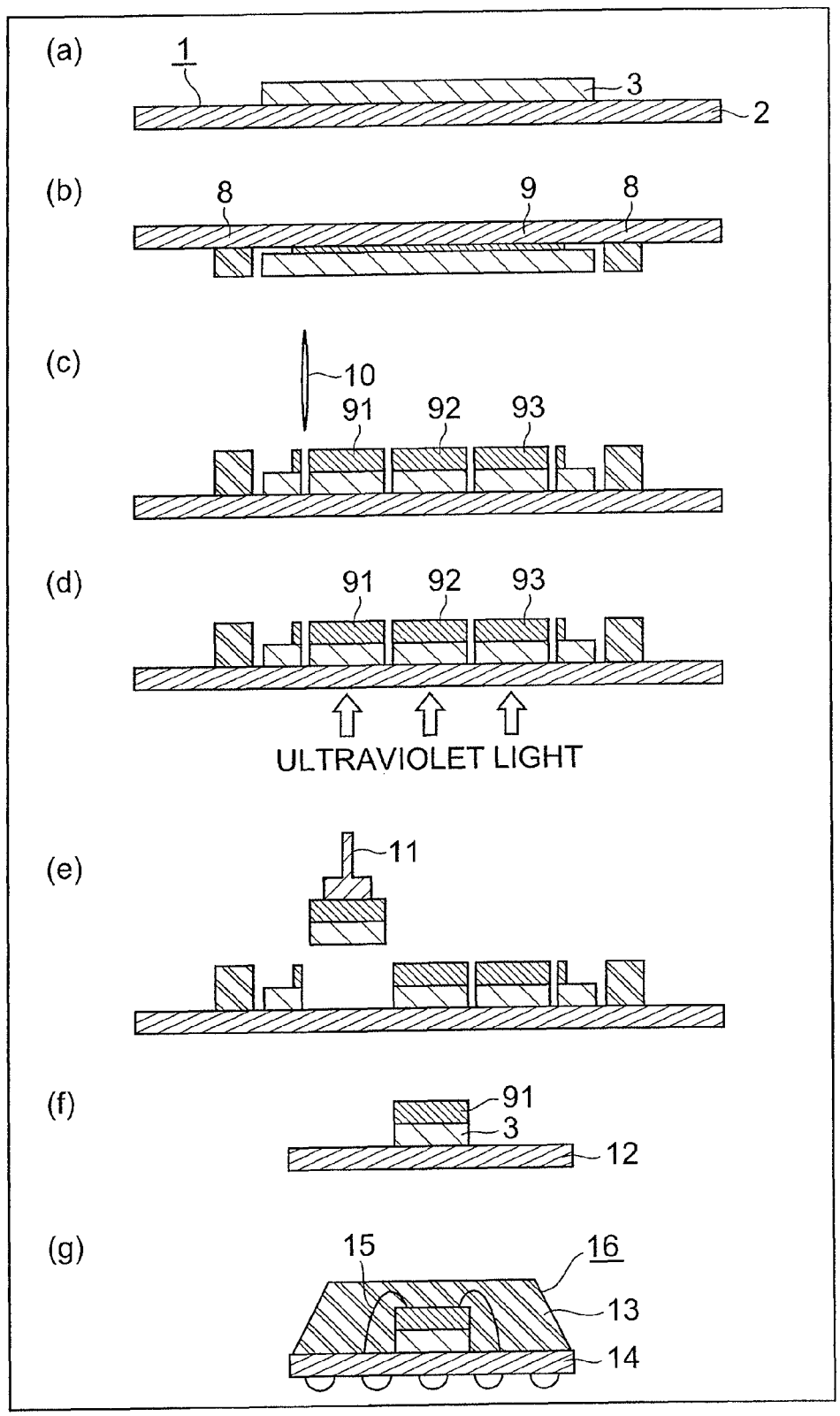
FIG. 10 is a schematic cross-sectional view showing a typical use of the adhesive bonding sheet of the present invention.

(a) of FIG. 10 shows the adhesive bonding sheet 1 comprising a supporting substrate 2, and an adhesive bonding layer 3 precut to the same shape as a wafer and with a slightly larger surface area than the wafer on the supporting substrate 2.

Next, a semiconductor wafer 9 in preparation for dicing, is affixed at room temperature or with heating to the adhesive bonding layer 3 of the adhesive bonding sheet 1 ((b) of FIG. 10), dicing is performed by a dicing saw 10 ((c) of FIG. 10), and rinsing and drying steps are added if required. At this time, the semiconductor element is kept well stuck to the adhesive bonding sheet, so the semiconductor element does not fall off between the aforesaid steps.

Next, the adhesive bonding sheet is irradiated by radiation so as to cause the adhesive bonding sheet, which has the property of polymerizing due to radiation, to polymerize and cure ((d) of FIG. 10). The radiation may be for example ultraviolet light, an electron beam or infrared light. In (d) of FIG. 10, the case of ultraviolet light is shown. The adhesive bonding sheet is irradiated with ultraviolet light from the adhesive bonding sheet surface having ultraviolet light polymerizing properties. The irradiation intensity and irradiation amount increase or decrease depending on the composition of the adhesive bonding sheet, but the irradiation intensity is normally of the order of 3-100 mW/$cm^2$ and irradiation amount is normally of the order of 80-1000 mJ, which is an indication of the radiation amount required to effectively polymerize the photoreactive monomer. At this time, the supporting substrate 2 of the adhesive bonding sheet should be transparent to ultraviolet light. In other words, in the context of the present invention, the term "optically transparent supporting substrate" means a supporting substrate which is transparent to the radiation used at this stage.

Subsequently, semiconductor elements 91, 92 and 93 obtained by dicing are picked up together with the adhesive bonding sheet after ultraviolet light curing by a suction collet 11 (FIG. 10(e)), pressed onto semiconductor element mounting supporting substrate 12 at room temperature or while heating to 40-150° C. (FIG. 10(f)), and heated. Due to the heating, the adhesive bonding sheet develops a reliable adhesive force, which completes the adhesion of the semiconductor element 91 and semiconductor element mounting supporting substrate 12. Also, as shown for example in FIG. 10(g), the semiconductor device is normally subjected to a fixing step for making a wire bond 15, a step for sealing with a seal material 16 and a step for providing a solder ball 14 and electrically connecting it to an external board (motherboard), and since it normally passes through one or more thermal history cycles, the aforesaid adhesive agent layer can also be heated and cured using this thermal history.

EXAMPLES

Hereafter, the present invention will be described referring to specific examples, but it should be understood that the invention is not to be construed as being limited in any way thereby.

Example 1

100 weight parts of HTR-860-P3 (Imperial Chemical Industries Ltd., acrylic rubber containing glycidyl groups, molecular weight 1,000,000, Tg −7° C.), 5.4 weight parts of YDCN-703 (Toto Kasei Ltd., brand name, o-cresol novolak epoxy resin, epoxy equivalent 210), 16.2 weight parts of YDF-8170C (Toto Kasei Ltd., brand name, bisphenol F epoxy resin, epoxy equivalent 157), 15.3 weight parts of Plyophen LF2882 (Dainippon Ink Chemical Industries Ltd., brand name, bisphenol A novolak resin), 0.1 weight parts of NUCA-189 (Nippon Unica Ltd., brand name, γ-mercaptopropyltrimethoxysilane), 0.3 weight parts of NUCA-1160 (Nippon Unica Ltd., brand name, γ-ureidopropyltriethoxysilane), 30 weight parts of A-DPH (Shin-Nakamura Chemical Industries Ltd., brand name, dipentaerythritol hexacrylate), 1.5 weight parts of Irgacure 369 (Ciba Specialty Chemicals, brand name, 2-benzyl-2-dimethylamino-1-(4-morpholinophenyl)-butanone-1-one: I-369) and cyclohexanone were mixed together with stirring, and vacuum degassed. This adhesive varnish was coated on surface release-treated polyethylene terephthalate (Teijin Ltd., Teijin Tetron film: A-31) as a protective film of thickness 75 μm, and heat-dried at 80° C. for 30 minutes to obtain an adhesive bonding sheet. The adhesive bonding sheet was laminated together with an optically transparent supporting substrate of thickness 100 μm (Ronseal, brand name, soft polyolefin film: POF-120A) to obtain an adhesive bonding sheet comprising a protective film (surface release-treated polyethylene terephthalate), adhesive bonding layer and optically transmitting supporting substrate.

Example 2

An identical procedure to that of Example 1 was performed, except that the amount of photoreactive monomer (A-DPH) was changed to 50 parts in the blending proportion of adhesive bonding components.

Example 3

An identical procedure to that of Example 1 was performed, except that in the mixture of adhesive bonding components, the silane coupling agent was not added.

Example 4

An identical procedure to that of Example 1 was performed, except that the supporting member was Gunze DDD (brand name) instead of POF-120A.

Example 5

An identical procedure to that of Example 1 was performed, except that the adhesive component HTR-860-P3 was replaced by HTR-860-P5 (Nagase ChemteX Ltd., brand name, glycidyl group-containing acrylic rubber, molecular weight 800,000, Tg −10° C.).

Example 6

An identical procedure to that of Example 1 was performed, except that in the blending proportion of the adhesive bonding components, YDF-8170 was not added, and 5.5 weight parts of EXA-4850-150 (Dai Nippon Ink Chemicals Ltd., brand name, flexible and tough liquid epoxy resin, epoxy equivalent 450) was added.

Example 7

An identical procedure to that of Example 1 was performed, except that the photoreactive monomer in the adhesive bonding components, Irgacure 369, was replaced by 1.5 weight parts of Irgacure 907 (Ciba Specialty Chemicals, brand name, 2-methyl-1(4-(methylthio)phenyl-2-morpholinopropane-1-one: I-907).

Example 8

An identical procedure to that of Example 1 was performed, except that A-DPH in the adhesive bonding components was replaced by 30 weight parts of A-9300 (Shin Nakamura Chemical Industries Ltd., brand name, ethoxylated isocyanuric acid triacrylate).

Example 9

An identical procedure to that of Example 1 was performed, except that the supporting substrate was FHF-100 (Thermo Ltd., brand name, low density polyethylene terephthalate/vinyl acetate/low density polyethylene terephthalate triple layer film) instead of POF-120A.

Comparative Example 1

An identical procedure to that of Example 1 was performed, except that A-DPH, the photoreactive monomer in the adhesive bonding components, was replaced by BPE-200 (Shin Nakamura Chemical Industries Ltd., brand name, 2.2-bis[4-(methacryloxy diethoxy)phenyl]propane).

Comparative Example 2

An identical procedure to that of Example 1 was performed, except that A-DPH, the photoreactive monomer in the adhesive bonding components, was replaced by 30 weight parts of FA-321M (Hitachi Chemicals Ltd., brand name, ethylene oxide-modified bisphenol A dimethylacrylate).

Comparative Example 3

An identical procedure to that of Example 1 was performed, except that the photoreactive monomer in the adhesive bonding components was not added.

Comparative Example 4

An identical procedure to that of Example 1 was performed, except that the photoinitiator in the mixture of adhesive bonding components was not added. The compositions or the like of aforementioned Examples and Comparative Examples are shown in Tables 1 and 2.

The examples and comparative examples were evaluated by the following test methods. The results are shown in Tables 3 and 4.

(1) Room Temperature Sticking Properties

An adhesive bonding sheet was stuck to a silicone wafer of thickness 280 μm on a wafer mount, and the room temperature sticking properties were evaluated. "A" shows that sticking property was satisfactory.

(2) Chip Scattering After Dicing

An adhesive bonding sheet was stuck to a silicone wafer of thickness 280 μm, and the silicon wafer with adhesive bonding sheet was mounted on a dicing device. Next, a semiconductor wafer was fixed on the dicing device, diced into rectangle of 3.2 mm×3.2 mm at a speed of 10 mm/sec, and the number of semiconductor chips which peeled away from the adhesive bonding sheet due to poor tackiness was measured.

(3) Pickup Properties

A semiconductor wafer was fixed on a dicing device, diced into rectangle of 3.2 mm×3.2 mm pieces at a speed of 10 mm/sec, the body to be irradiated was then disposed at a point with an irradiation of 50 mW/cm$^2$ using a Fusion exposure device (brand name: AEL-1B/M), the adhesive bonding sheet was irradiated from the substrate film side for 8 seconds, and it was examined whether or not the semiconductor chip with adhesive bonding layer could be picked up from the optically transparent supporting substrate.

A: Almost all chips could be picked up
B: 50-90% of diced chips could be picked up
C: The number of diced chips which could be picked up was 50% or less.

(4) Initial Shearing Adhesion

A semiconductor wafer was fixed on a dicing device, diced into rectangles of 3.2 mm×3.2 mm at a speed of 10 mm/sec, irradiated by ultraviolet light, and the semiconductor chip with adhesive bonding layer was picked up from the optically transparent supporting substrate. It was then die-bonded to an organic substrate (PSR-4000, SR-AUS5, thickness of 0.2 mm) under the conditions of 180° C., 2 MPa, 30 sec, and post-curing was performed at 175° C. for 5 hours to obtain a test sample. This test sample was held on a hot plate at 265° C. for 30 seconds, and the shearing adhesive strength between the chip and organic substrate was measured.

(5) Reflow Cracking Resistance

The adhesive bonding sheet was die-bonded to a wiring board under the conditions of 100° C., 200 gf, 30 seconds, a semiconductor chip was molded to a predetermined shape using a sealing agent (Hitachi Chemicals: CEL-9700-HF10), and heat curing was performed at 175° C. and 5 hours to obtain a package. The cured package was left under the conditions of 85° C./60% RH for 7 days, the package was passed through an IR reflow furnace such that the maximum temperature of the package surface was 260° C. and this temperature was maintained for 20 seconds, and the cracks in the package were observed visually and by ultrasonic micrograph. The number of cracks per 10 packages at this time was recorded.

A: packages with no cracks
B: packages with cracks

TABLE 1

| | | | Ex. 1 | Ex. 2 | Ex. 3 | Ex. 4 | Ex. 5 | Ex. 6 | Ex. 7 |
|---|---|---|---|---|---|---|---|---|---|
| Adhesive bonding layer | (A) High molecular weight component | HTR-860-P3 | 100 | 100 | 100 | 100 | — | 100 | 100 |
| | | HTR-860-P5 | — | — | — | — | 100 | — | — |
| | (B) Epoxy resin | YDCN-703 | 5.4 | 5.4 | 5.4 | 5.4 | 5.4 | — | 5.4 |
| | | EXA-4850 | — | — | — | — | — | — | — |
| | | YDF-8170 | 16.2 | 16.2 | 16.2 | 16.2 | 16.2 | — | 16.2 |
| | (C) Curing agent | LF2882 | 15.3 | 15.3 | 15.3 | 15.3 | 15.3 | 30.6 | 15.3 |
| | (D) Photoreactive monomer | A-DPH (250° C. or more) | 30 | 50 | 30 | 30 | 30 | 30 | 30 |
| | | A-9300 (250° C. or more) | — | — | — | — | — | — | — |
| | (Brackets indicate Tg.) | BPE-200 (75° C.) | — | — | — | — | — | — | — |
| | | FA-321M (150° C. or less) | — | — | — | — | — | — | — |
| | (E) Photoinitiator | I-369 | 1.5 | 1.5 | 1.5 | 1.5 | 1.5 | 1.5 | — |
| | | I-907 | — | — | — | — | — | — | 1.5 |
| | Silane coupling agent | NUCA-189 | 0.1 | 0.1 | — | — | 0.1 | 0.1 | 0.1 |
| | | NUCA-1160 | 0.3 | 0.3 | — | — | 0.3 | 0.3 | 0.3 |
| | 90° peel strength (N/m) after UV irradiation | | 2 | 1 | 2 | 6 | 3 | 7 | 5 |
| | Tack strength at 25° C. prior to UV irradiation | | 46 | 80 | 38 | 46 | 33 | 99 | 78 |
| Supporting substrate | Surface energy (mN/m) | | 33 | 33 | 33 | 36 | 33 | 33 | 33 |
| | Elastic modulus at 25° C. (mPa) | | 120 | 120 | 120 | 88 | 120 | 120 | 120 |
| | Yield elongation at 25° C. | | 24 | 24 | 24 | 8 | 24 | 24 | 24 |
| | Name | | POF-120A | POF-120A | POF-120A | DDD | POF-120A | POF-120A | POF-120A |

TABLE 2

| | | | Ex. 8 | Ex. 9 | Comp. Ex. 1 | Comp. Ex. 2 | Comp. Ex. 3 | Comp. Ex. 4 |
|---|---|---|---|---|---|---|---|---|
| Adhesive bonding layer | (A) High molecular weight component | HTR-860-P3 | 100 | 100 | 100 | 100 | 100 | 100 |
| | | HTR-860-P5 | — | — | — | — | — | — |
| | (B) Epoxy resin | YDCN-703 | 5.4 | 5.4 | 5.4 | 5.4 | 5.4 | 5.4 |
| | | EXA-4850 | — | — | — | — | — | — |
| | | YDF-8170 | 16.2 | 16.2 | 16.2 | 16.2 | 16.2 | 16.2 |
| | (C) Curing agent | LF2882 | 15.3 | 15.3 | 15.3 | 15.3 | 15.3 | 15.3 |
| | (D) Photoreactive monomer | A-DPH (250° C. or more) | — | 30 | — | — | — | 30 |
| | | A-9300 (250° C. or more) | 30 | — | — | — | — | — |
| | (Brackets indicate Tg.) | BPE-200 (75° C.) | — | — | 30 | — | — | — |
| | | FA-321M (150° C. or less) | — | — | — | 30 | — | — |
| | (E) Photoinitiator | I-369 | 1.5 | 1.5 | 1.5 | 1.5 | 1.5 | — |
| | | I-907 | — | — | — | — | — | — |
| | Silane coupling agent | NUCA-189 | 0.1 | 0.1 | 0.1 | 0.1 | 0.1 | 0.1 |
| | | NUCA-1160 | 0.3 | 0.3 | 0.3 | 0.3 | 0.3 | 0.3 |
| | 90° peel strength (N/m) after UV irradiation | | 4 | 2 | 10 | No peeling | No peeling | No peeling |
| | Tack strength at 25° C. prior to UV irradiation | | 103 | 46 | 352 | 244 | 21 | 87 |
| Supporting substrate | Surface energy (mN/m) | | 33 | 33 | 33 | 33 | 33 | 33 |
| | Elastic modulus at 25° C. (mPa) | | 120 | 138 | 120 | 120 | 120 | 120 |
| | Yield elongation at 25° C. | | 24 | 20 | 24 | 24 | 24 | 24 |
| | Name | | POF-120A | FHF-100 | POF-120A | POF-120A | POF-120A | POF-120A |

TABLE 3

| | | Ex. 1 | Ex. 2 | Ex. 3 | Ex. 4 | Ex. 5 | Ex. 6 | Ex. 7 |
|---|---|---|---|---|---|---|---|---|
| Evaluation | Sticking properties at room temperature | A | A | A | A | A | A | A |
| | Chip scattering after dicing | None | None | None | None | None | None | None |
| | Pickup properties | A | A | A | A | A | A | A |
| | Shearing adhesion strength | 3.26 | 1.11 | 2.21 | 3.04 | 2.99 | 2.88 | 3.10 |
| | Reflow cracking resistance | 0/10 | 0/10 | 0/10 | 0/10 | 0/10 | 0/10 | 0/10 |
| | T1 (° C.) | 40 | 40 | 40 | 60 | 40 | 40 | 40 |

TABLE 3-continued

|  | Ex. 1 | Ex. 2 | Ex. 3 | Ex. 4 | Ex. 5 | Ex. 6 | Ex. 7 |
|---|---|---|---|---|---|---|---|
| α1 (ppm/° C.) | 264 | 264 | 264 | 266 | 264 | 264 | 264 |
| T2 (° C.) | 25 | 25 | 25 | 25 | 25 | 25 | 25 |
| α2 (ppm/° C.) | 264 | 264 | 264 | 266 | 264 | 264 | 264 |
| T1 × α1 − T2 × α2 (ppm) | 3960 | 3960 | 3960 | 9310 | 3960 | 3960 | 3960 |

TABLE 4

| | | Ex. 8 | Ex. 9 | Comp. Ex. 1 | Comp. Ex. 2 | Comp. Ex. 3 | Comp. Ex. 4 |
|---|---|---|---|---|---|---|---|
| Evaluation | Sticking properties at room temperature | A | A | A | A | A | A |
| | Chip scattering after dicing | None | None | None | None | None | None |
| | Pickup properties | A | A | B | C | C | C |
| | Shearing adhesion strength | 5.60 | 3.26 | 1.08 | 2.85 | 3.52 | 1.32 |
| | Reflow cracking resistance | 0/10 | 0/10 | 10/10 | 8/10 | 0/10 | 10/10 |
| | T1 (° C.) | 40 | 60 | 40 | 40 | 40 | 40 |
| | α1 (ppm/° C.) | 264 | 1460 | 264 | 264 | 264 | 264 |
| | T2 (° C.) | 25 | 25 | 25 | 25 | 25 | 25 |
| | α2 (ppm/° C.) | 264 | 568 | 264 | 264 | 264 | 264 |
| | T1 × α1 − T2 × α2 (ppm) | 3960 | 73400 | 3960 | 3960 | 3960 | 3960 |

From the above results, it is also seen that in Examples 1-9, the room temperature sticking properties, chip scattering after dicing, pickup properties and reflow cracking resistance are satisfactory, but in Comparative Examples 1 and 2, Tg of the cured product obtained by ultraviolet light irradiation of the photoreactive monomer is low, so the reflow resistance is poor. It is also seen that, in Comparative Example 3, the photoreactive monomer is not present, so pickup properties after ultraviolet light irradiation are poor, whereas in Comparative Example 4, the photoinitiator is not present, so pickup properties after ultraviolet irradiation are poor, and as unreacted photoreactive monomer is present, reflow resistance is poor.

INDUSTRIAL APPLICABILITY

Since the photo-curing adhesive bonding sheet of the present invention has the aforesaid structure, it has superior room temperature sticking properties, dicing properties and reflow cracking resistance, so it is suitable for use as an adhesive resin for fixing electronic materials.

The invention claimed is:

1. An adhesive bonding sheet having an optically transmitting supporting substrate and an adhesive bonding layer, and capable of being used in both a dicing step and a semiconductor element adhesion step,
   wherein the elastic modulus of the supporting substrate at 25° C. is 1000 MPa or less, and
   wherein the adhesive bonding layer comprises (a) a polymer component having a weight average molecular weight of 100,000 or more including functional groups, (b) an epoxy resin, (c) an epoxy resin curing agent, (d) a photoreactive monomer, wherein the Tg of cured material of the photoreactive monomer, obtained by ultraviolet light irradiation, is 250° C. or more, and (e) a photoinitiator.

2. The adhesive bonding sheet according to claim 1, wherein the polymer component is a (meth)acrylic copolymer comprising 0.5-6 weight % of epoxy group-containing repeating units based on the total weight of the polymer component.

3. The adhesive bonding sheet according to claim 1, wherein usage amount of the epoxy resin is 5-250 weight parts relative to 100 weight parts of the polymer component.

4. The adhesive bonding sheet according to claim 1, wherein the surface free energy of the supporting substrate is 50 mN/m or less.

5. The adhesive bonding sheet according to claim 1, wherein the 90° peel adhesion strength after ultraviolet irradiation of the adhesive bonding layer relative to the supporting substrate is 10 N/m or less.

* * * * *